United States Patent
Kobayashi et al.

(10) Patent No.: US 10,460,915 B2
(45) Date of Patent: Oct. 29, 2019

(54) ROTATABLE SUBSTRATE SUPPORT HAVING RADIO FREQUENCY APPLICATOR

(71) Applicant: Applied Materials, Inc., Santa Clara, CA (US)

(72) Inventors: Satoru Kobayashi, Santa Clara, CA (US); Kirby Hane Floyd, San Jose, CA (US); Hiroji Hanawa, Sunnyvale, CA (US); Soonam Park, Sunnyvale, CA (US); Dmitry Lubomirsky, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 286 days.

(21) Appl. No.: 15/582,282

(22) Filed: Apr. 28, 2017

(65) Prior Publication Data

US 2017/0236693 A1    Aug. 17, 2017

Related U.S. Application Data

(63) Continuation of application No. 14/091,057, filed on Nov. 26, 2013, now abandoned.
(Continued)

(51) Int. Cl.
    *H01L 21/687*    (2006.01)
    *H01J 37/32*     (2006.01)
    *H02K 7/14*      (2006.01)

(52) U.S. Cl.
    CPC ..... *H01J 37/32697* (2013.01); *H01J 37/3211* (2013.01); *H01J 37/3244* (2013.01);
    (Continued)

(58) Field of Classification Search
    CPC ............. H01J 37/32697; H01J 37/3211; H01J 37/32357; H01J 37/32715;
    (Continued)

(56) References Cited

U.S. PATENT DOCUMENTS

2002/0139307 A1    10/2002    Ryding et al.
2003/0047199 A1    3/2003     Worm
(Continued)

FOREIGN PATENT DOCUMENTS

JP    H05-198390 A    8/1993
JP    H08162288 A     6/1996
(Continued)

OTHER PUBLICATIONS

Japanese Office Action for Application No. 2016-517530 dated Apr. 24, 2018.
(Continued)

*Primary Examiner* — Yuechuan Yu
(74) *Attorney, Agent, or Firm* — Patterson + Sheridan LLP

(57) ABSTRACT

A substrate support assembly includes a shaft assembly, a pedestal coupled to a portion of the shaft assembly, and a first rotary connector coupled to the shaft assembly, wherein the first rotary connector comprises a first coil member surrounding a rotatable shaft member that is electrically coupled to the shaft assembly, the first coil member being rotatable with the rotatable shaft, and a second coil member surrounding the first coil member, the second coil member being stationary relative to the first coil member, wherein the first coil member electrically couples with the second coil member when the rotating radio frequency applicator is energized and provides a radio frequency signal/power to the pedestal through the shaft assembly.

20 Claims, 6 Drawing Sheets

Related U.S. Application Data

(60) Provisional application No. 61/882,942, filed on Sep. 26, 2013.

(52) U.S. Cl.
CPC .. *H01J 37/32082* (2013.01); *H01J 37/32357* (2013.01); *H01J 37/32715* (2013.01); *H01J 37/32724* (2013.01); *H01L 21/68792* (2013.01); *H02K 7/14* (2013.01); *H01J 2237/332* (2013.01); *H01J 2237/334* (2013.01)

(58) Field of Classification Search
CPC ............ H01J 37/32724; H01J 37/3244; H01J 2237/332; H01J 2237/334; H01J 37/32082; H02K 7/14; H01L 21/68792
See application file for complete search history.

(56) References Cited

U.S. PATENT DOCUMENTS

| | | | |
|---|---|---|---|
| 2003/0129106 | A1* | 7/2003 | Sorensen ............ C23C 16/4405 422/186.05 |
| 2005/0205110 | A1* | 9/2005 | Kao .................. H01J 37/32082 134/1.1 |
| 2006/0005930 | A1 | 1/2006 | Ikeda et al. |
| 2006/0231034 | A1 | 10/2006 | Goto et al. |
| 2011/0115378 | A1 | 5/2011 | Lubomirsky et al. |
| 2012/0097332 | A1 | 4/2012 | Lin et al. |
| 2013/0337635 | A1 | 12/2013 | Yamawaku et al. |
| 2014/0174660 | A1 | 6/2014 | Iwasaki |

FOREIGN PATENT DOCUMENTS

| | | |
|---|---|---|
| JP | 2002110555 A | 4/2002 |
| JP | 2004342984 A | 12/2004 |
| JP | 20060005930 A | 1/2006 |
| JP | 2007-335709 A | 12/2007 |
| JP | 2013042061 A | 2/2013 |
| KR | 2011-0008537 A | 1/2011 |
| WO | 00/59018 A1 | 10/2000 |
| WO | 2013/001833 A1 | 1/2013 |

OTHER PUBLICATIONS

Taiwan Search Report dated Jul. 12, 2018 for Application No. 107102855.

Taiwan Office Action for Application No. 103131404 dated Nov. 9, 2017.

* cited by examiner

ROTATABLE SUBSTRATE SUPPORT HAVING RADIO FREQUENCY APPLICATOR

CROSS-REFERENCE TO RELATED APPLICATIONS

This application is a continuation of U.S. patent application Ser. No. 14/091,057, filed Nov. 26, 2013, which application claims benefit of U.S. Patent Application Ser. No. 61/882,942, filed Sep. 26, 2013, which is hereby incorporated herein by reference.

BACKGROUND

Field

Embodiments of the present invention generally relate to apparatus and methods utilized in the manufacture of semiconductor devices. More particularly, embodiments of the present invention generally relate to apparatus and methods for a rotatable substrate support that is utilized to apply radio frequency power utilized in the manufacture of semiconductor devices.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

One process utilized to form these structures includes plasma processing. In one of these plasma processes, a substrate is positioned on a substrate support in a chamber, and process gases are energized to form a plasma of the process gases. The plasma may be utilized for deposition of materials, or etching of materials, in order to form the structures. The plasma formation may be facilitated by radio frequency (RF) application to the gases from a showerhead within the chamber, an inductively coupled RF device coupled to the chamber, RF applied by or through the substrate support, and combinations thereof.

Rotatable substrate supports capable of RF application (i.e., RF "hot" or a bias power) suffer from serious drawbacks. Historically, electrical connection between any rotating parts has been attained by, for instance, rolling RF-rings, RF-brushes, RF pantographs and capacitive structures. However, when these connections are made post RF-match, arcing is produced due to high-voltage/current. This arcing typically results in damage to the chamber. Thus, there is a need for an improved rotating substrate support.

SUMMARY

A substrate support assembly includes a shaft assembly, a pedestal coupled to a portion of the shaft assembly, and one or more rotary connectors coupled to the shaft assembly, wherein one of the one or more rotary connectors comprises a rotating radio frequency applicator. The rotating radio frequency applicator comprises a first coil member surrounding a rotatable shaft that is electrically coupled to the shaft assembly, the first coil member being rotatable with the rotatable shaft, and a second coil member surrounding the first coil member, the second coil member being stationary relative to the first coil member, wherein the first coil member electrically couples with the second coil member when the rotating radio frequency applicator is energized and provides a radio frequency signal to the pedestal through the shaft assembly.

In another embodiment, a substrate support assembly includes a shaft assembly, a pedestal coupled to a portion of the shaft assembly, and a first rotary connector coupled to the shaft assembly. The first rotary connector comprises a rotatable coil member surrounding a rotatable dielectric shaft that is electromagnetically coupled to the shaft assembly during operation, a stationary coil member surrounding the rotatable coil member, wherein the rotatable coil member electromagnetically couples with the stationary coil member when the rotatable radio frequency applicator is energized and provides a radio frequency power to the pedestal through the shaft assembly, and a conductive housing disposed about the stationary coil member.

In another embodiment, a substrate support assembly includes a shaft assembly, a pedestal coupled to a portion of the shaft assembly, and one or more rotary connectors coupled to the shaft assembly, wherein one of the one or more rotary connectors comprises a rotating radio frequency applicator. The rotating radio frequency applicator comprises a rotating conductive member surrounding a rotatable shaft member that is electromagnetically coupled to the shaft assembly during operation, and a stationary conductive member at least partially surrounding the rotating conductive member, wherein the rotating conductive member electromagnetically couples with the stationary conductive member when the rotatable radio frequency applicator is energized and provides a radio frequency power to the pedestal through the shaft assembly, and a conductive housing surrounding the rotatable radio frequency applicator.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention relate to a processing chamber having a rotatable substrate support capable of radio frequency (RF) biasing. The processing chamber and/or the substrate support may be used in substrate processing in the manufacture of electronic devices. Substrate processing includes deposition processes, etch processes, as well as other low pressure or thermal processes used to manufacture electronic devices on substrates. The processing chamber and/or the substrate support described herein may be utilized in systems sold by Applied Materials, Inc. of Santa Clara, Calif., as well as other systems available from other manufacturers.

Figure 1:
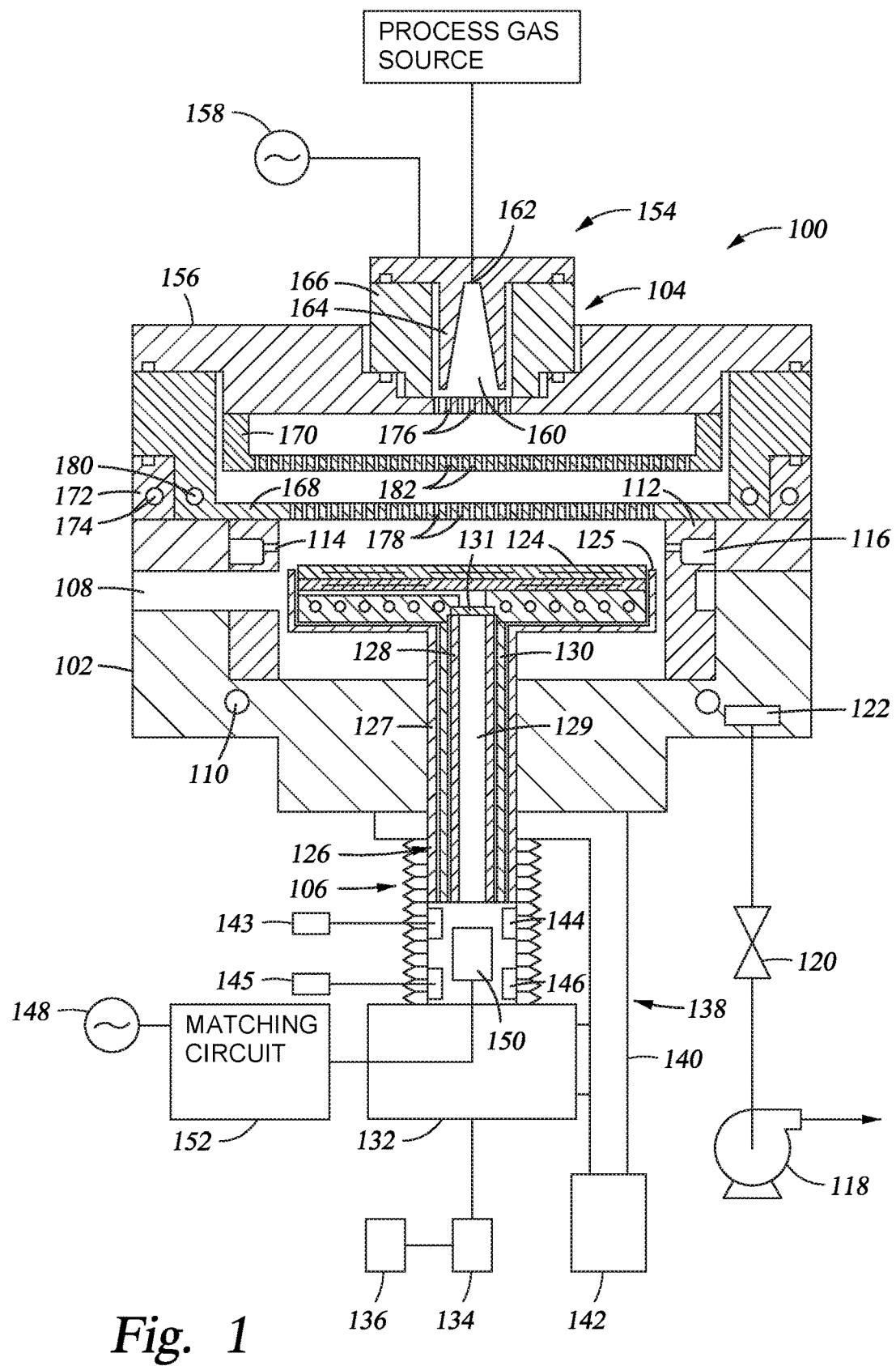
FIG. 1 is a cross section view of an illustrative processing chamber in which embodiments of the invention may be practiced.

FIG. 1 is a side cross sectional view of an illustrative processing chamber 100 suitable for conducting an etch or a deposition process. In one embodiment, the processing chamber 100 may be configured to remove materials from a material layer disposed on a substrate surface. The processing chamber 100 may be particularly useful for performing plasma assisted dry etch process. One processing chamber that may be adapted to benefit from the invention is a Siconi™ chamber which is available from Applied Materials, Santa Clara, Calif. It is noted that other vacuum processing chambers available from other manufactures may also be adapted to benefit from the invention.

The processing chamber 100 provides both heating and cooling of a substrate surface without breaking vacuum. In one embodiment, the processing chamber 100 includes a chamber body 102, a lid assembly 104, and a substrate support assembly 106. The lid assembly 104 is disposed at an upper end of the chamber body 102, and the substrate support assembly 106 is at least partially disposed within the chamber body 102.

The chamber body 102 includes a slit valve opening 108 formed in a sidewall thereof to provide access to the interior of the processing chamber 100. The slit valve opening 108 is selectively opened and closed to allow access to the interior of the chamber body 102 by a wafer handling robot (not shown).

In one or more embodiments, the chamber body 102 includes a channel 110 formed therein for flowing a heat transfer fluid therethrough. The heat transfer fluid can be a heating fluid or a coolant and is used to control the temperature of the chamber body 102 during processing and substrate transfer. Control of the temperature of the chamber body 102 is important to prevent unwanted condensation of the gas or byproducts on the chamber walls. Exemplary heat transfer fluids include water, ethylene glycol, or a mixture thereof. An exemplary heat transfer fluid may also include nitrogen gas.

The chamber body 102 can further include a liner 112 that surrounds the substrate support assembly 106. The liner 112 is removable for servicing and cleaning. The liner 112 can be made of a metal such as aluminum, a ceramic material, or any other process compatible material. The liner 112 can be bead blasted to increase surface roughness and/or surface area which increases the adhesion of any material deposited thereon, thereby preventing flaking of material which results in contaminants of the processing chamber 100. In one or more embodiments, the liner 112 includes one or more apertures 114 and a pumping channel 116 formed therein that is in fluid communication with a vacuum system. The apertures 114 provide a flow path for gases into the pumping channel 116, which provides an egress for the gases within the processing chamber 100.

The vacuum system can include a vacuum pump 118 and a throttle valve 120 to regulate flow of gases through the processing chamber 100. The vacuum pump 118 is coupled to a vacuum port 122 disposed in the chamber body 102 and therefore, in fluid communication with the pumping channel 116 formed within the liner 112. The terms "gas" and "gases" are used interchangeably, unless otherwise noted, and refer to one or more precursors, reactants, catalysts, carrier, purge, cleaning, combinations thereof, as well as any other fluid introduced into the chamber body 102.

The substrate support assembly 106 includes a pedestal 124 that is coupled to a shaft assembly 126. The pedestal 124 has an upper surface adapted to support a substrate (not shown). The pedestal 124 may be configured as an electrostatic chuck to secure the substrate and is adapted to apply a RF power. A shield member 125 may be disposed about the periphery of the pedestal 124. The shield member 125 may comprise a conductive material, such as aluminum, and is utilized to control plasma within the chamber body 102. The shield member 125 may also be utilized as a RF current carrying member during operation of the processing chamber 100.

The shaft assembly 126 may comprise at least three tubular members that move vertically and rotate within the chamber body 102. For example, the shield member 125 may be coupled to a shaft portion 127 that is disposed in an opening in the chamber body 102. A central shaft 128 is disposed within the shaft assembly 126 and includes a hollow portion or core 129. The central shaft 128 is made of a conductive material, such as aluminum, and is utilized as a RF current carrying member. The central shaft 128 and the shaft portion 127 of the shield member 125 are electrically separated by an insulative shaft 130 disposed therebetween.

An RF stop plate 131 may be disposed in the pedestal 124. The perimeter of the RF stop plate 131 is connected to the central shaft 128. The RF stop plate 131 may include holes (not shown) for signal members, such as wires, routed from the shaft assembly 126 to components disposed in the pedestal 124. The shielded metals of the wires may be connected to the holes. In one embodiment, the RF structure apparently has a form of the folded coaxial structure with DC short on the rotation RF side. The material for the insulative shaft 130 may include ceramics, polymeric materials that are resistant to heat and process chemistry, as well as other dielectric process resistant materials. The material for the insulative shaft 130 may include ceramics, polymeric materials that are resistant to heat and process chemistry, as well as other dielectric process resistant materials. Examples of materials for the insulative shaft 130 include TEFLON® materials, ULTEM™ materials, and the like. The shaft assembly 126 is coupled to an actuator 132 that facilitates rotation of the shaft assembly 126 and the pedestal 124 as well as the shield member 125. A first rotary connector 134 is coupled to the substrate support assembly 106 to provide coolant from a coolant source 136 to the pedestal 124. The first rotary connector 134 may be a rotary union adapted to flow a liquid coolant. Vertical movement of the substrate support assembly 106 and the first rotary connector 134 is provided by an actuator assembly 138. The actuator assembly 138 may include a support member 140 coupled to the chamber body 102 and an actuator 142.

The pedestal 124 may include a heater, one or more chucking electrodes, one or more temperature sensors and coolant passages. In one or more embodiments, the substrate (not shown) may be secured to the pedestal 124 using an electrostatic chuck. An electrostatic chuck typically includes at least a dielectric material that surrounds an electrode (not shown) embedded in the pedestal 124. The dielectric portion of the chuck electrically insulates the chuck electrode from the substrate and from the remainder of the substrate support assembly 106.

Coolant may be provided to the coolant passages by the first rotary connector 134. The pedestal 124 may also include passages formed therein for providing a gas to the backside of the substrate mounted on the pedestal 124. The pedestal 124 may also be connected to a RF power source 148 by a fourth rotary connector 150. The fourth rotary connector 150 may comprise one or more rotatable conductive members that electromagnetically couples with one or more stationary conductive members during operation.

In one embodiment, a matching circuit 152 may be coupled between the fourth rotary connector 150 and the RF power source 148 when the RF power source 148 does not include an integral matching circuit. The RF power source 148 is generally capable of producing an RF signal having a frequency from about 50 kHz to about 200 MHz and a power between about 0 Watts and about 5000 Watts. In one embodiment, the RF power source 148 is coupled to a conductive plate in the pedestal 124. The RF bias power from the RF power source 148 may also be used to excite and sustain a plasma discharge formed from the gases disposed in the processing region of the chamber body 102. In other embodiments, power for chucking electrodes within the pedestal 124 may be provided from a power source 143 via a second rotary connector 144. The power source 143 may be a direct current (DC) power supply and the second rotary connector 144 may be a slip ring or roll ring connector. In this configuration, RF bias from the RF power source 148 is used to excite and sustain a plasma of processing gases in the chamber body 102. Gases may be provided to the pedestal 124 from a gas source 145 by a third rotary connector 146. The third rotary connector 146 may be a rotary gas union.

The pedestal 124 may comprise a bi-polar chuck having electrodes disposed in a puck. The pedestal 124 may also include a RF electrode, configured as a cathode, made of a conductive material, which may be separated from the puck by a ceramic material. The cathode may comprise an aluminum plate that is disposed below the puck. The aluminum plate may be directly coupled to the central shaft 128 which provides RF energy to the cathode from the fourth rotary connector 150.

In one embodiment, the lid assembly 104 includes at least two stacked components configured to form a plasma volume or cavity therebetween. The lid assembly 104 includes a first electrode 154 ("upper electrode") disposed vertically above a second electrode 156 ("lower electrode") confining a plasma volume or cavity 160 therebetween. The first electrode 154 is connected to a power source 158, such as an RF power supply, and the second electrode 156 is connected to ground, forming a capacitance between the two electrodes 154, 156.

In some embodiments, the lid assembly 104 includes one or more gas inlets 162 (only one is shown) that are at least partially formed within the first electrode 154. The one or more process gases enter the lid assembly 104 via the one or more gas inlets 162. The one or more gas inlets 162 are in fluid communication with the plasma cavity 160 at a first end thereof and coupled to one or more upstream gas sources and/or other gas delivery components, such as gas mixers, at a second end thereof.

In some embodiments, the first electrode 154 has an expanding section 164 that houses the plasma cavity 160. In one or more embodiments, the expanding section 164 is an annular member that has an inner surface or diameter that gradually increases from an upper portion thereof to a lower portion thereof. The expanding section 164 is in fluid communication with the gas inlet 162 as described above. The first end of the one or more gas inlets 162 can open into the plasma cavity 160 at the upper most point of the inner diameter of the expanding section 164. Similarly, the first end of the one or more gas inlets 162 can open into the plasma cavity 160 at any height interval along the inner diameter of the expanding section 164. Although not shown, two gas inlets 162 can be disposed at opposite sides of the expanding section 164 to create a swirling flow pattern or "vortex" flow into the expanding section 164 which helps mix the gases within the plasma cavity 160.

The lid assembly 104 can further include an isolator ring 166 that electrically isolates the first electrode 154 from the second electrode 156. The isolator ring 166 can be made from aluminum oxide or any other insulative, process compatible material. The isolator ring 166 surrounds or substantially surrounds at least the expanding section 164.

The lid assembly 104 can further include a distribution plate 168 and blocker plate 170 adjacent the second electrode 156. The second electrode 156, distribution plate 168 and blocker plate 170 can be stacked and disposed on a lid support plate 172 which is connected to the chamber body 102. A hinge assembly (not shown) can be used to couple the lid support plate 172 to the chamber body 102. The lid support plate 172 can include an embedded channel or passage 174 for housing a heat transfer medium. The heat transfer medium can be used for heating, cooling, or both, depending on the process requirements.

In one or more embodiments, the second electrode 156 can include a plurality of gas passages or apertures 176 formed beneath the plasma cavity 160 to allow gas from the plasma cavity 160 to flow therethrough. The distribution plate 168 may be substantially disc-shaped and also includes a plurality of apertures 178 or passageways to distribute the flow of gases therethrough. The apertures 178 can be sized and positioned about the distribution plate 168 to provide a controlled and even flow distribution to the chamber body 102 where the substrate to be processed is located. Furthermore, the apertures 178 prevent the gas(es) from impinging directly on the substrate surface by slowing and re-directing the velocity profile of the flowing gases, as well as evenly distributing the flow of gas to provide an even distribution of gas across the surface of the substrate.

In some embodiments, the distribution plate 168 includes one or more embedded channels or passages 180 for housing a heater or heating fluid to provide temperature control of the lid assembly 104. A resistive heating element (not shown) can be inserted within the passage 180 to heat the distribution plate 168. A thermocouple can be connected to the distribution plate 168 to regulate the temperature thereof. The thermocouple can be used in a feedback loop to control electric current applied to the heating element, as described above.

Alternatively, a heat transfer medium can be passed through the passage 180. The one or more passages 180 can contain a cooling medium, if needed, to better control temperature of the distribution plate 168 depending on the process requirements within the chamber body 102. Any heat suitable transfer medium may be used, such as nitrogen, water, ethylene glycol, or mixtures thereof, for example.

In one or more embodiments, the lid assembly 104 can be heated using one or more heat lamps (not shown). Typically, the heat lamps are arranged about an upper surface of the distribution plate 168 to heat the components of the lid assembly 104 including the distribution plate 168 by radiation.

The blocker plate 170 may optionally be disposed between the second electrode 156 and the distribution plate 168 when present. The blocker plate 170 is removably mounted to a lower surface of the second electrode 156. The blocker plate 170 may be in good thermal and electrical contact with the second electrode 156. In one or more embodiments, the blocker plate 170 can be coupled to the second electrode 156 using a bolt or similar fastener. The blocker plate 170 can also be threaded or screwed onto an outer diameter of the second electrode 156.

The blocker plate 170 includes a plurality of apertures 182 to provide a plurality of gas passages from the second electrode 156 to the distribution plate 168. The apertures 182 can be sized and positioned about the blocker plate 170 to provide a controlled and even flow distribution of gases to the distribution plate 168.

In one embodiment, the RF power source 148 is coupled to the conductive plate disposed in the pedestal 124 through a matching circuit 152. The signal generated by the RF power source 148 is delivered through the matching circuit 152 to the pedestal 124 through the fourth rotary connector 150 to ionize the gas mixture provided in the processing chamber 100, thereby providing ion energy necessary for performing a deposition, etch, or other plasma enhanced process. Additional bias power sources may be coupled to the fourth rotary connector 150 to control the characteristics of the plasma in the processing chamber 100 as needed.

In one embodiment, the RF power source 148 provides a bias power to the pedestal 124 thereby bombarding ions in the plasma formed in the processing chamber 100. For example, a plasma sheath may be formed in the processing chamber 100 and the positive ions within the plasma sheath may be accelerated by RF and plasma self DC bias while the negative ions are generally stopped in the pre-sheath region. Thus, the bias power provides enhanced etching by enabling highly directional etching. For example, the positively charged ions from the plasma body enables etching straight down (i.e., vertical) to form fine structures on a substrate, such as trenches and vias. The pedestal 124 is also rotated during processing which may alleviate nonuniformities in the processing conditions within the processing chamber 100. For example, nonuniformities in process conditions such as temperature nonuniformity, pressure nonuniformities, plasma density, and other conditions in the processing chamber 100, may be in effect averaged out by rotating the pedestal 124. Thus, the substrate supported on the pedestal will experience substantially uniform processing conditions when rotated.

Figure 2:
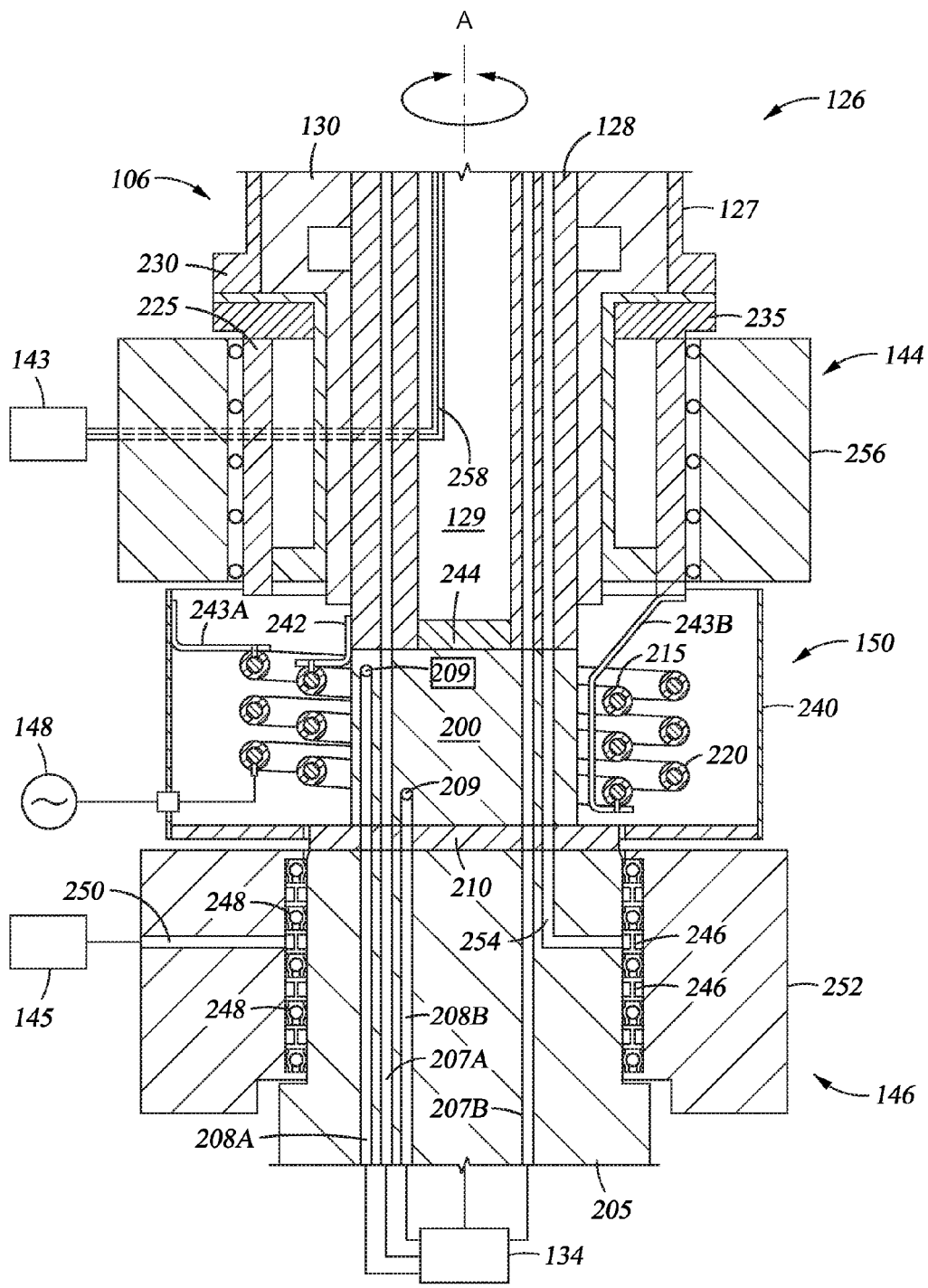
FIG. 2 is a partial side cross-sectional view of the substrate support assembly of FIG. 1.

FIG. 2 is a partial side cross-sectional view of the substrate support assembly 106 of FIG. 1 showing embodiments of the first rotary connector 134, the second rotary connector 144, the third rotary connector 146, and the fourth rotary connector 150 in more detail. Additionally, rotatable and stationary portions of the substrate support assembly 106 will be indentified for clarity.

Rotatable portions of the substrate support assembly 106 include the shaft assembly 126, particularly the shaft portion 127 of the shield member 125 (shown in FIG. 1), the central shaft 128, and the insulative shaft 130. The central shaft 128 couples to a dielectric shaft 200, which is part of the fourth rotary connector 150. The fourth rotary connector 150 may be disposed within a housing 240 made of a material that is a good conductor (e.g. aluminum, copper). The dielectric shaft 200 couples to a base shaft 205, which is part of the third rotary connector 146. In one embodiment, the base shaft 205 is fabricated from a stainless steel material and the dielectric shaft 200 is fabricated from a ceramic material. In one embodiment, the dielectric shaft 200 is hollow.

The fourth rotary connector 150 includes a rotatable coil 215 (which electromagnetically couples with a stationary coil 220 when energized). A rotary plate 210, fabricated from a material that is a good conductor (e.g. Al, Cu), may be disposed between the dielectric shaft 200 and the base shaft 205. Additionally, the shaft assembly 126 may include a metal plate 244 made of a material that is a good conductor (e.g. Al, Cu). Each of the housing 240, the rotary plate 210 and the metal plate 244 are utilized to minimizes RF leakage by preventing formation of a RF magnetic field outside of the fourth rotary connector 150.

For example, each of the housing 240, the rotary plate 210 and the metal plate 244 prevents formation of a RF magnetic field outside of the fourth rotary connector 150, which is formed by counter RF magnetic field appearing on the rotary plate 210 as an eddy current. In other words, the RF magnetic field is confined inside the housing 240. In turn, dissipation of RF magnetic field on the wall of the housing 240 caused by the eddy current is reduced by utilizing highly conductive metals, such as copper and aluminum, for surfaces adjacent to the fourth rotary connector 150. To further increase efficiency, a dielectric break (shown as a dielectric slit 610 in FIG. 6) may be disposed in the outer wall 240 to prevent or minimize the formation of a circular eddy current on the inner surface of the housing 240. While not shown, the rotary plate 210 and the metal plate 244 may include one or more dielectric breaks formed therein or thereon to prevent or minimize the formation of eddy currents on surfaces thereof.

Other rotatable portions include a rotatable first portion 225 of the second rotary connector 144 that electrically couples to an end 230 of the shaft portion 127 of the shield member 125. The end 230 is distal to the pedestal 124 shown in FIG. 1. A conductive spacer 235 may be disposed between the end 230 and the rotatable first portion 225. A conduit 207 may be formed through each of the rotatable portions of the shaft assembly 126, such as the base shaft 205, the rotary plate 210, the dielectric shaft 200, and the central shaft 128 in order to provide coolant from the first rotary connector 134 to the pedestal 124 (shown in FIG. 1).

RF energy is provided to the stationary coil 220 from the RF power sources 148 and/or the matching circuit 152 (shown in FIG. 1). One or both of the rotatable coil 215 and the stationary coil 220 may include an insulating member surrounding a conductive core. The RF energy magnetically couples with the rotatable coil 215 and the RF energy is efficiently provided to the pedestal 124 (shown in FIG. 1) on or through the central shaft 128 via a connector 242. The central shaft 128, as well as the shaft portion 127 of the shield member 125 (shown in FIG. 1), may be fabricated from an aluminum material, and the two elements are insulated from one another by the insulative shaft 130. Ground connectors for the rotatable coil 215 and the stationary coil 220 are shown as strips 243A and 243B, respectively. The metal plate 244 and the connector 242 as well as the strips 243A and 243B may be a high conductivity material, such as copper, or aluminum. The connector 242, as well as the strips 243A and 243B, should not be placed between the stationary coil 220 and the rotatable coil 215, because the stationary coil 220 generates leaking magnetic field in-between the rotatable coil 215, which forms strong eddy currents on the surfaces in proximity to those areas. In this embodiment, the strip 243B is inside the rotatable coil 215 (i.e., between the dielectric shaft 200 and the rotatable coil 215), where the magnetic fields originating from the primary and secondary load currents substantially cancel each other out.

A RF return on the rotating portion starts with the strip 243B of the rotatable coil 215, and goes to the inner part of the first portion 225 of the second rotary connector 144, and to the conductive spacer 235, and finally to the shaft portion 127 of the shield member 125. A Rf return on the stationary portion starts with strip 243A, and goes to the wall of the housing 240, and to a ground of the matching circuit 152 (shown in FIG. 1). When operating, the two separated RF return paths may create issues with the electrostatic chucking system, because the RF return paths must operate as a ground-reference of the applied DC voltage. For this purpose, conductive roll-rings/brushes/slip rings are used between the first portion 225 and the stationary housing 256 of the second rotary connector 144 in order to make two DC grounds unified. It is further noted that the roll-rings/brushes/slip rings are placed on the points where the RF currents are small. If placed in positions where RF currents are great, arcing may occur.

Gases may be provided to the pedestal 124 (shown in FIG. 1) from the gas source 145 by the third rotary connector 146. The third rotary connector 146 may be a rotary union comprising a plurality of annular gas passages 246 alternating with a plurality of annular seals 248. Each of the annular seals 248 may be a dynamic vacuum seal. Gas is provided from the gas source 145 to at least one of the annular gas passages 246 by a conduit 250 formed in a stationary housing 252. The gas source 145 may include purge gases, or gases for backside cooling, such as helium. The gas is contained in the annular gas passages 246 between the outer surface of the base shaft 205 and the inner surface of the stationary housing 252 by the annular seals 248. The gas is then provided to an inlet conduit 254 formed in the base shaft 205. The inlet conduit 254 extends to the pedestal 124 through the rotary plate 210, the dielectric shaft 200 and the central shaft 128. O-rings (not shown) may be used at each intersection of the inlet conduit 254 with the rotary plate 210, the dielectric shaft 200 and the central shaft 128 where the inlet conduit 254 as the inlet conduit 254 extends to the pedestal 124. The use of a ceramic material for the dielectric shaft 200 reduces heating of the fluids (e.g., water or other coolants from the first rotary connector 134, and/or gases from the third rotary connector 146) passing therethrough by eddy currents caused by leaking magnetic fields. Additionally, the eddy currents and/or heating may be further exacerbated when metallic materials are used for the dielectric shaft 200.

Power for chucking electrodes and/or the heater within the pedestal 124 (shown in FIG. 1) may be provided from the power source 143 by the second rotary connector 144. Wires may be provided from the power source 143 through a stationary housing 256 of the second rotary connector 144. Wires 258 transport signals from resistance temperature detectors (RTD's), thermo couplers, or thermistors installed in the pedestal 124, and supply a power for electrostatic chucking (DC), as well as power for heaters in the pedestal 124 (3 or 1-phase AC, or DC). The wires 258 are disposed within the shaft assembly 126. The wires 258 may be disposed in openings or spaces (not shown) formed in the central shaft 128 and/or within the hollow core 129. While only the wires 258 are shown, other signal members, which may be one or more wires, cables, fiber optics, or other conduit capable of transmitting electrical signals and power, may be coupled to the pedestal 124 similar to the wire 258. The wires 258 should be insulated from the shaft assembly 126 by an insulative covering or coating. Furthermore, the wires 258 should be shielded by a metal sheath. If the wires 258 were not shielded, RF power present in openings or spaces where the wires 258 are disposed may transmit on the surfaces of the wires 258. Particularly, in this case, the surfaces of the wires 258 work as the inner conductors of RF, whereas the inner wall of the hollow core 129 works as the outer conductor of RF. This eventually carries unwanted RF power to the pedestal 124 in efficient manner as transverse electromagnetic waves, which produces unwanted RF spots that will produce non-uniformity during etch processes. However, even though the metal sheaths are used to cover the wires 258, the RF power still transmits on the surface of the metal sheaths. However, use of the RF stop plate 131 (shown in FIG. 1) prevents the unwanted RF power from impacting the pedestal 124. The perimeter of the RF stop plate 131 is connected to the RF hot central shaft 128, and the holes in the RF stop plate 131 (for threading the wires 258) are connected to the shielded metals of the wires 258. In this manner, the RF structure has a form of a folded coaxial structure with DC short on the RF rotation side. As a result, the plasma-self-DC bias is received by ceramic portions of the electrostatic chuck in the pedestal 124.

The embodiment of the substrate support assembly 106 described in FIG. 2 has been tested showing 75% efficiency of RF transmittance even though the test bench had a large leak of RF power, and thus, the actual efficiency is expected to be higher. The inventors believe that up to an 80% increase in efficiency over the test bench design may be realized in practice.

Figure 3:
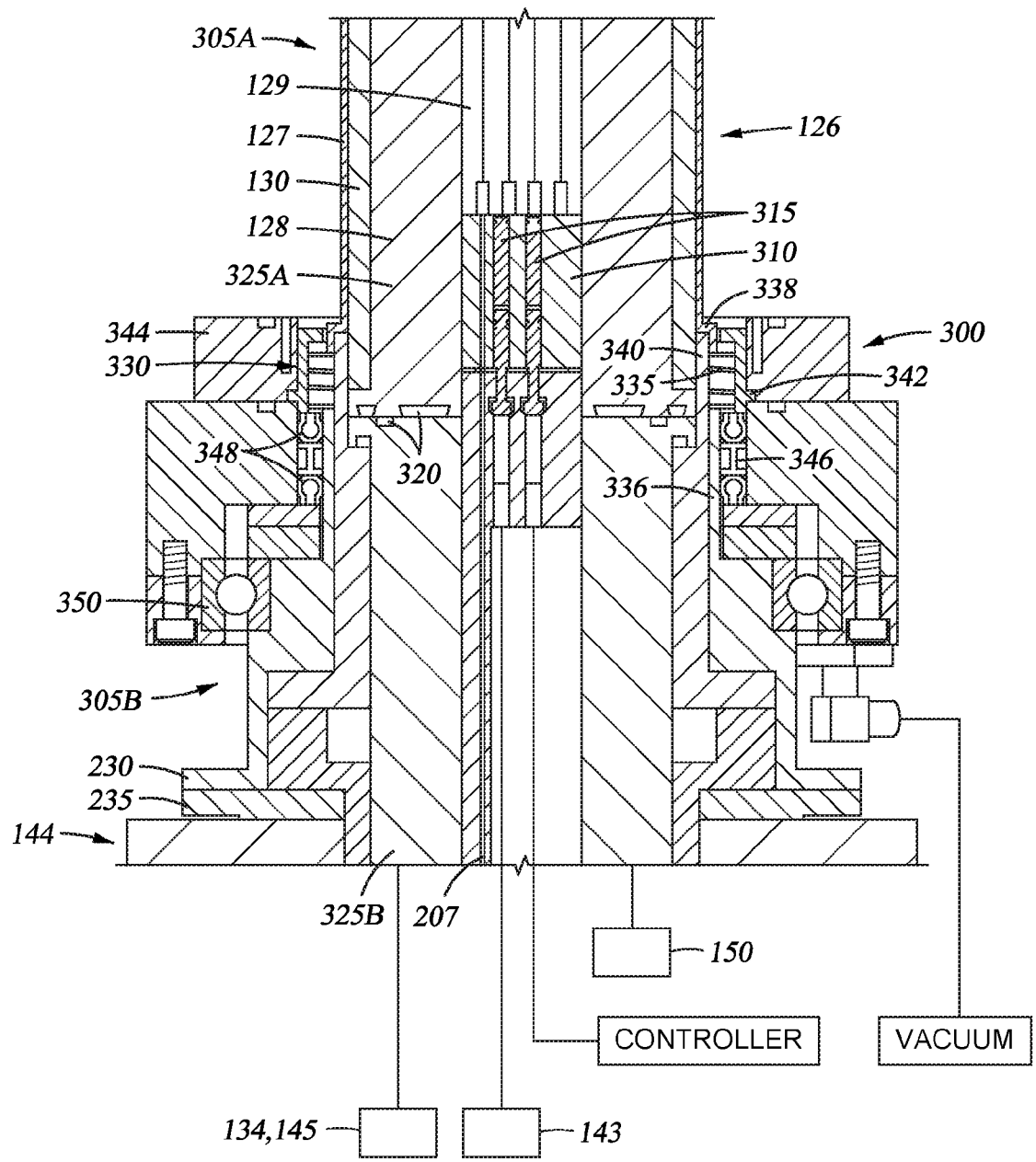
FIG. 3 is a side cross-sectional view of a portion of the shaft assembly showing one embodiment of a detachment mechanism.

FIG. 3 is a side cross-sectional view of a portion of the shaft assembly 126 showing one embodiment of a detachment mechanism 300 for the shaft assembly 126. The detachment mechanism 300 provides a two-piece shaft assembly 126 whereby a first portion 305A of the shaft assembly 126 may be attached or detached easily from a second portion 305B. The first portion 305A may include the central shaft 128, the insulative shaft 130 and the shaft portion 127 of the shield member 125, as well as the pedestal 124 (shown in FIG. 1). The detachment mechanism 300 may be used to bifurcate the shaft assembly 126 for servicing and/or installation into the processing chamber 100 (shown in FIG. 1).

In one embodiment, the detachment mechanism 300 includes a plug assembly 310 having one or more electrical connectors 315 disposed therein, sealing surfaces 320 at the interface between a first central shaft 325A and a second central shaft 325B, and a flexible conductive connection 330. The sealing surfaces 320 may include seals, such as o-rings (not shown). The plug assembly 310 includes electrical connectors for components in the pedestal 124 (shown in FIG. 1). The flexible conductive connection 330 may be used to facilitate a ground of DC, or RF return path in the processing chamber 100. The flexible conductive connection 330 may be a conductive spring 335 disposed between a conductive intermediate shaft member 336 and an end 338 of the shaft portion 127 of the shield member 125. An insulating sleeve 340 electrically separates the conductive spring 335 from the central shaft 128. Additionally, and insulative cover 342 electrically insulates the conductive spring 335 from a housing 344. The detachment mechanism 300 may also include a pumping channel 346 that is sealed by dynamic seals 348. The pumping channel 346 may be coupled to a vacuum pump for secondary pumping. A bearing 350, which may comprise a ceramic material, is also shown coupled to the shaft assembly 126.

Figure 4:
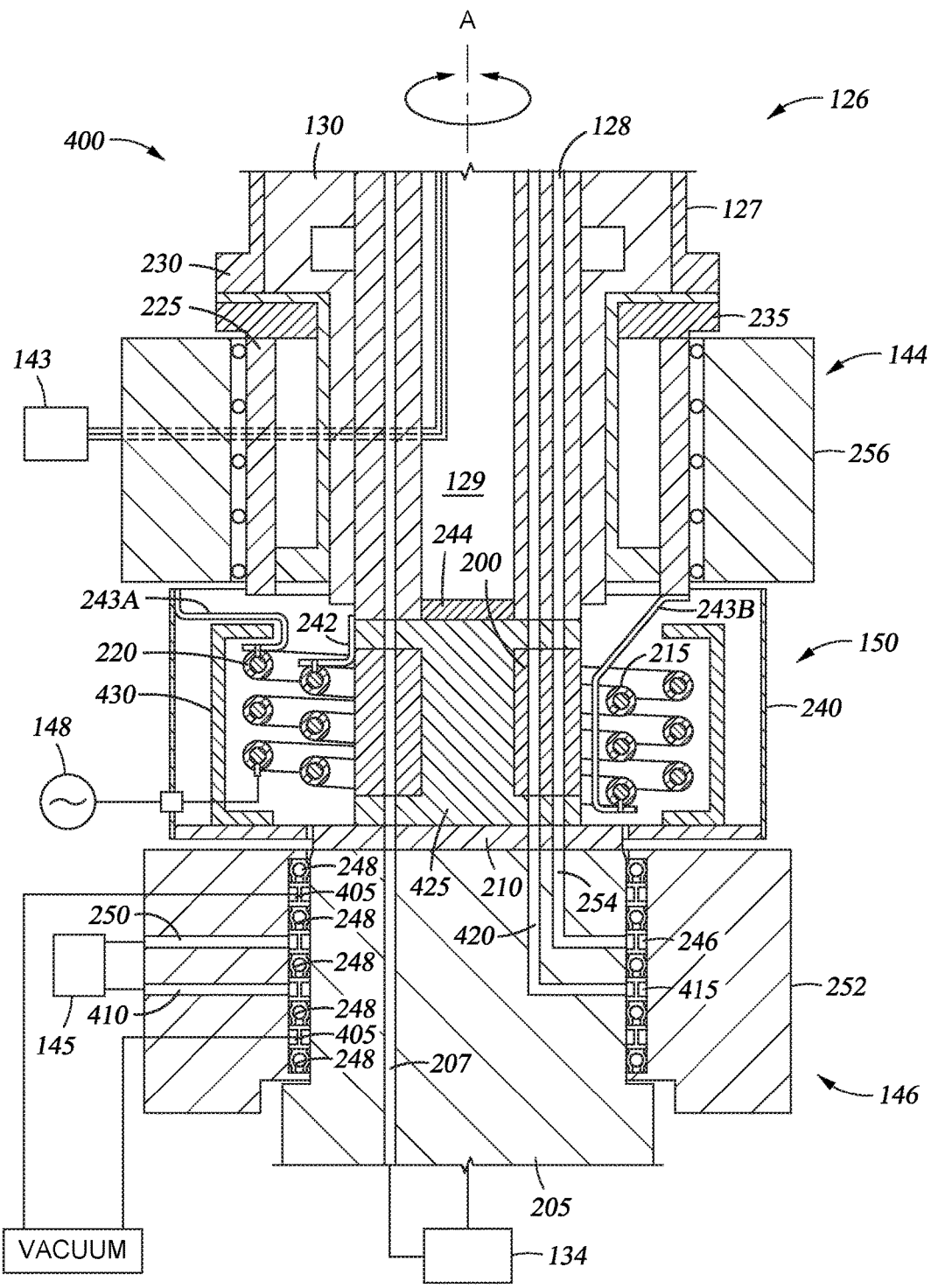
FIG. 4 is a side cross-sectional view of a portion of another embodiment of a substrate support assembly that may be used in the chamber of FIG. 1.

FIG. 4 is a side cross-sectional view of a portion of another embodiment of a substrate support assembly 400 that may be used in the processing chamber 100 of FIG. 1. The substrate support assembly 400 is similar to the substrate support assembly 106 shown in FIG. 2 with the following differences in the third rotary connector 146 and the fourth rotary connector 150. The third rotary connector 146 of the substrate support assembly 400 includes one or more pumping channels 405 coupled to a vacuum pump. Each of the one or more pumping channels 405 includes two annular seals 248 surrounding each pumping channel 405. Additionally, the third rotary connector 146 includes an additional gas conduit 410 for providing a purge gas or backside cooling gas to the pedestal 124 (shown in FIG. 1). Gas is provided from the gas source 145 by the conduit 250 and to the annular gas passage 246 as described in FIG. 2. An additional gas may be provided by an inlet conduit 410 formed in the stationary housing 252. The inlet conduit 410 provides the gas to an annular gas passage 415 and to an inlet conduit 420. The inlet conduits 254 and 420 extend to the pedestal 124 through the rotary plate 210, the dielectric shaft 200 and the central shaft 128. O-rings (not shown) may be used at each intersection of the inlet conduits 254 and 420 with the rotary plate 210, the dielectric shaft 200 and the central shaft 128 where the inlet conduit 254 as the inlet conduits 254 and 410 extend to the pedestal 124. A description of a third rotary connector that may be utilized in the substrate support assembly 400 may be found in United States Patent Publication No. 2002/0139307, which published Oct. 3, 2002.

The fourth rotary connector 150 is similar to the fourth rotary connector 150 described in FIG. 2 with the exception of a rotating ferrite shell 425 disposed in or on the dielectric shaft 200 as well as a stationary ferrite shell 430 surrounding the stationary coil 220. The rotating ferrite shell 425 and/or the stationary ferrite shell 430 provides a substantially closed magnetic circuit that minimizes magnetic flux leakage. The ferrite material also reduces the occurrence of eddy currents on the surfaces of components adjacent to the fourth rotary connector 150. In reducing the occurrence of eddy currents, dissipation of the magnetic hysteresis in the ferrites may occur. Since magnetic flux density B can be kept low at such high frequencies of 1-200 MHz, there is little concern that the magnetic saturation may be reached in a chosen ferrite. Hence, the ferrite for the rotating ferrite shell 425 and the stationary ferrite shell 430 should be a low hysteresis ferrite material in the range of RF power used in the processing chamber 100. In general, ferrite structures shown in FIG. 4 are preferable at low RF frequencies (e.g., ≤1 MHz).

Figure 5A:
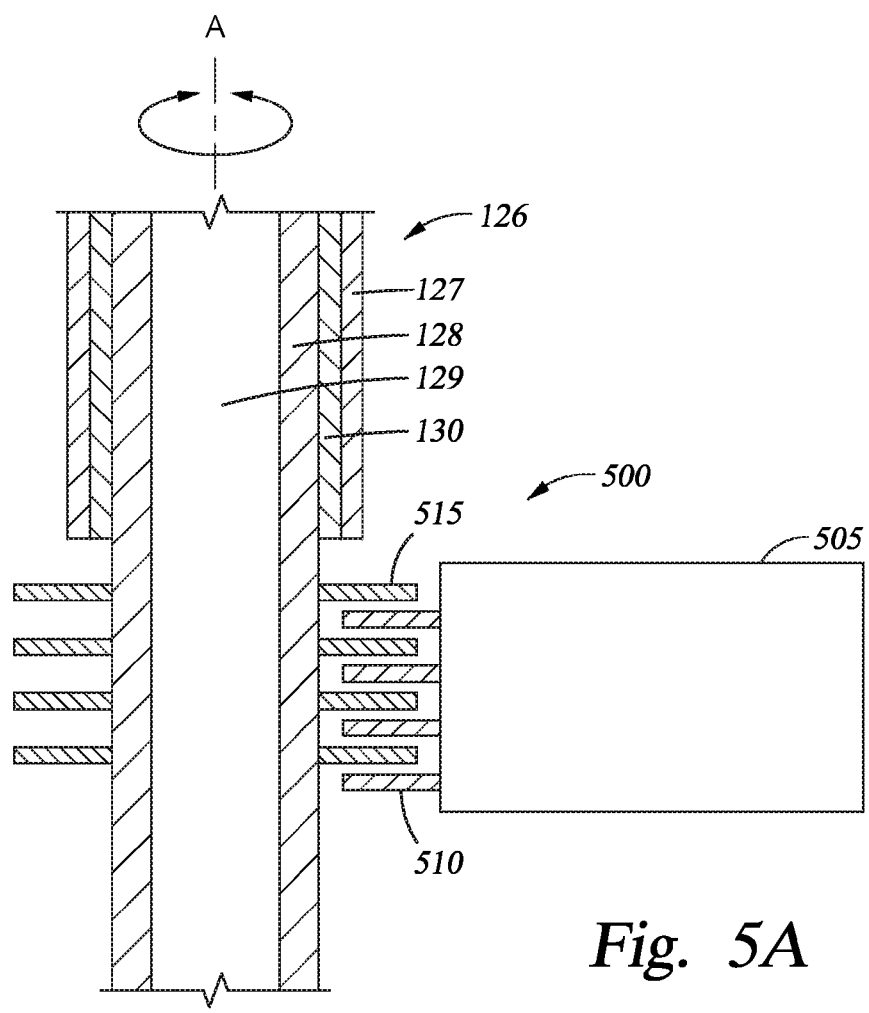
FIG. 5A is a side cross-sectional view of a portion of another embodiment of a substrate support assembly that may be used in the chamber of FIG. 1.
Figure 5B:
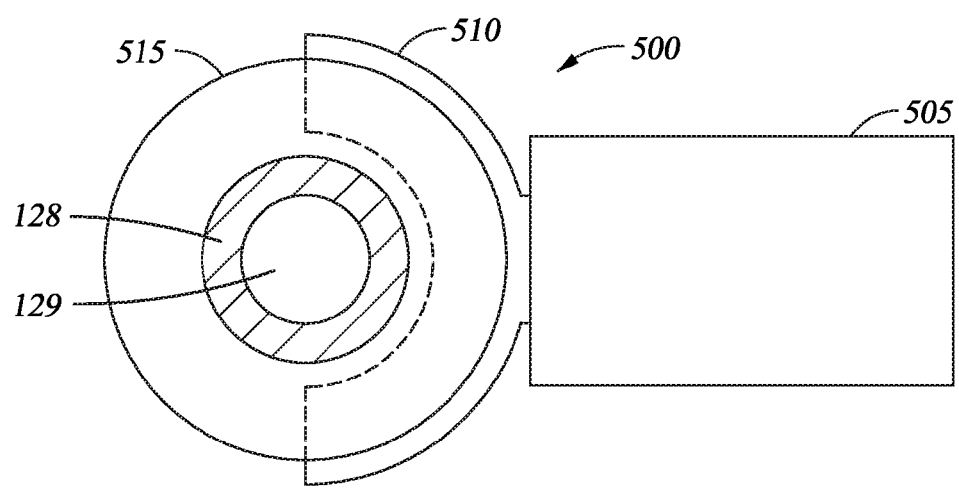
FIG. 5B is a top cross-sectional view of the substrate support assembly of FIG. 5A.

FIG. 5A is a side cross-sectional view of a portion of another embodiment of a substrate support assembly 500 that may be used in the processing chamber 100 of FIG. 1. FIG. 5B is a top cross-sectional view of the substrate support assembly 500 of FIG. 5A. In this embodiment, the fourth rotary connector 150 is depicted as a capacitively coupled RF applicator. The fourth rotary connector 150 includes a stationary inner conductor 505 having one or more stationary capacitors 510 that interface with one or more rotating capacitors 515. The stationary inner conductor 505 may be coupled to the RF source 148 (and matching circuit 152, if needed (both shown in FIG. 1)). The rotating capacitors 515 may be coupled directly to the central shaft 128 and where RF energy may be provided to the pedestal 124 (shown in FIG. 1).

Figure 6:
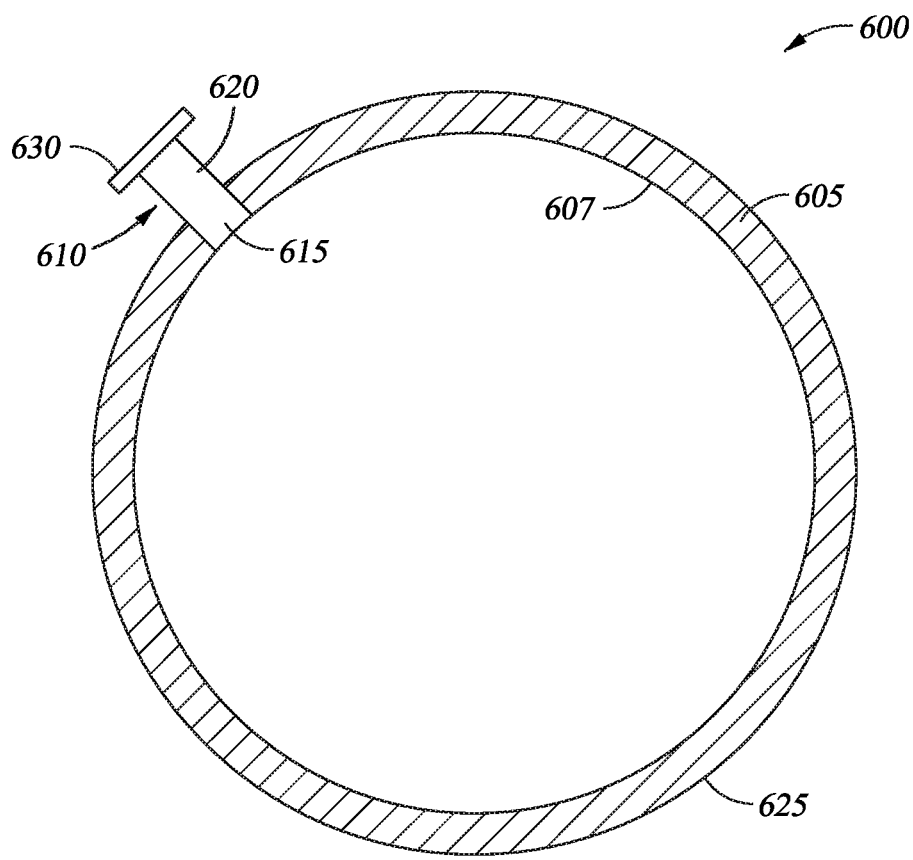
FIG. 6 is a top cross-sectional view of one embodiment of a housing that may be utilized with the substrate support assembly of FIG. 2.

FIG. 6 is a top cross-sectional view of one embodiment of a housing 600 that may be utilized as the housing 240 described in FIG. 2. The housing 600 includes a circular body 605 comprising a conductive material such as copper or aluminum. During operation of the substrate support assembly 106 (shown in FIG. 1), eddy currents may form on an inner surface 607 of the circular body 605. In order to minimize or prevent the formation of an eddy current, the circular body 605 includes a dielectric slit 610. The dielectric slit 610 comprises a slotted portion 615, formed within and along the longitudinal axis of the circular body 605, which is filled with a dielectric material 620. The dielectric material 620 may be a ceramic material or a polymer material. The dielectric material 620 may protrude radially outward from an outer surface 625 of the circular body 605. In one embodiment, the protruding surface of the dielectric material 620 may include a conductive cap 630. The conductive cap 630 is utilized to reduce leakage of RF current outside of the circular body 605. The dielectric material 620 may also extend into the slotted portion 615 to be coplanar or flush with the inner surface 607 of the circular body 605. For example, the slotted portion 615 may be formed completely through the circular body 605 and is filled with the dielectric material 620. As such, the dielectric material 620 breaks the circular body 605 and any RF current flowing along the inner surface 607 of the circular body 605 may be minimized or eliminated.

While the foregoing is directed to embodiments of the present invention, other and further embodiments of the invention can be devised without departing from the basic scope thereof, and the scope thereof is determined by the claims that follow.

The invention claimed is:

1. A plasma processing system comprising:
 a processing chamber comprising:
  a first electrode, wherein the first electrode at least partially defines a plasma cavity within the processing chamber, and
  a second electrode, wherein the second electrode defines a plurality of apertures through the second electrode, and wherein the second electrode at least partially defines the plasma cavity within the processing chamber;
  a plasma source electrically coupled with the first electrode and configured to generate a plasma within the plasma cavity; and
  a substrate support assembly including:
   a shaft assembly comprising a rotatable shaft surrounding a central conductive shaft, and an electrically insulative shaft positioned between the central conductive shaft and the rotatable shaft,
   a pedestal coupled to the central conductive shaft of the shaft assembly, and
   a first rotary connector coupled to the shaft assembly, wherein the first rotary connector comprises a rotatable radio frequency applicator, the rotatable radio frequency applicator comprising:
    a first coil member surrounding a rotatable shaft member that is electromagnetically coupled to the shaft assembly during operation, the first coil member being rotatable with the rotatable shaft member during operation,
    a second coil member surrounding the first coil member, the second coil member being stationary relative to the first coil member, wherein the first coil member electromagnetically couples with the second coil member when the rotatable radio frequency applicator is energized and provides a radio frequency power to the pedestal through the shaft assembly;
a first ground member coupling the first coil member with a rotatable portion of the shaft assembly; and
a second ground member coupling the second coil member with a stationary portion of the shaft assembly.

2. The plasma processing system of claim 1, wherein, during operation, the first ground member and the second ground member provide two separated RF return paths to make a unified DC ground reference.

3. The plasma processing system of claim 1, wherein the first coil member inductively couples with the second coil member when the rotating radio frequency applicator is energized.

4. The plasma processing system of claim 1, wherein the central conductive shaft is coupled to the rotatable shaft member, and the rotatable shaft member comprises a dielectric material.

5. The plasma processing system of claim 4, wherein the rotatable shaft member comprises a ferrite structure.

6. The plasma processing system of claim 1, further comprising:
a second rotary connector for providing a coolant to the pedestal.

7. The plasma processing system of claim 6, further comprising:
a third rotary connector for transmitting electrical signals/power to and from the pedestal.

8. The plasma processing system of claim 7, further comprising:
a fourth rotary connector for providing a gas to the pedestal.

9. The plasma processing system of claim 1, wherein the conductive central shaft is adapted to electromagnetically couple to the first coil member.

10. The plasma processing system of claim 9, wherein the conductive central shaft includes a circular conductive plate disposed at an end of the conductive central shaft disposed in the pedestal.

11. The plasma processing system of claim 9, further comprising a conductive housing disposed about the rotatable radio frequency applicator.

12. The plasma processing system of claim 11, wherein the conductive housing comprises a slit containing a dielectric material.

13. The plasma processing system of claim 12, wherein the slit is formed through the conductive housing.

14. A processing system comprising:
a processing chamber comprising:
a precursor inlet assembly,
a first distribution plate device defining a plurality of apertures providing fluid access to a processing region of the processing chamber, and
a second distribution plate defining a plurality of apertures, wherein the second distribution plate is positioned between the first distribution plate device and the precursor inlet assembly; and
a substrate support assembly comprising:
a shaft assembly comprising a rotatable shaft surrounding a central conductive shaft, and an electrically insulative shaft positioned between the central conductive shaft and the rotatable shaft,
a pedestal coupled to the central conductive shaft of the shaft assembly and positioned within the processing region of the processing chamber, and
a first rotary connector coupled to the shaft assembly, wherein the first rotary connector comprises:
a rotatable coil member surrounding a rotatable dielectric shaft that is electromagnetically coupled to the shaft assembly during operation,
a stationary coil member surrounding the rotatable coil member, wherein the rotatable coil member electromagnetically couples with the stationary coil member when the rotatable coil member is energized and provides a radio frequency power to the pedestal via a connector coupled to the central portion of the shaft assembly, and
a conductive housing disposed about the stationary coil member.

15. The processing system of claim 14, wherein the conductive housing comprises a circular housing surrounding the stationary coil member and one or more conductive plates surrounding the rotatable dielectric shaft.

16. The processing system of claim 14, wherein, during operation, two separated RF return paths are formed to make a unified DC ground reference.

17. A plasma processing system comprising:
a processing chamber comprising:
a precursor inlet assembly,
a plasma source coupled with the precursor inlet assembly
a first distribution plate device defining a plurality of apertures providing fluid access to a processing region of the processing chamber, and
a second distribution plate defining a plurality of apertures, wherein the second distribution plate is positioned between the first distribution plate device and the precursor inlet assembly; and
a substrate support assembly comprising:
a shaft assembly comprising a rotatable shaft surrounding a central conductive shaft, and an electrically insulative shaft positioned between the central conductive shaft and the rotatable shaft;
a pedestal coupled to the central conductive shaft of the shaft assembly; and
a first rotary connector coupled to the shaft assembly, wherein the first rotary connector comprises a rotatable radio frequency applicator, the rotatable radio frequency applicator comprising:
a rotating conductive member surrounding a rotatable shaft member that is coupled to the central conductive shaft and electromagnetically coupled to the shaft assembly during operation;
a stationary conductive member at least partially surrounding the rotating conductive member, wherein the rotating conductive member electromagnetically couples with the stationary conductive member when the rotatable radio frequency applicator is energized and provides a radio frequency power to the pedestal through the shaft assembly;
a conductive housing surrounding the rotatable radio frequency applicator;
a first ground member coupling the rotating conductive member with the rotatable shaft member; and
a second ground member coupling the stationary conductive member with the conductive housing.

18. The plasma processing system of claim 17, wherein, during operation, the first ground member and the second ground member provide two separated RF return paths to make a unified DC ground reference.

19. The plasma processing system of claim 17, wherein the rotatable shaft member comprises a dielectric material.

20. The plasma processing system of claim 19, wherein the rotatable shaft member comprises a ferrite structure.

* * * * *